US007994874B2

(12) United States Patent
Tripp

(10) Patent No.: US 7,994,874 B2
(45) Date of Patent: Aug. 9, 2011

(54) TAPERED DOUBLE BALUN

(75) Inventor: Victor K. Tripp, Tucker, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 249 days.

(21) Appl. No.: 12/455,697

(22) Filed: Jun. 5, 2009

(65) Prior Publication Data

US 2009/0302967 A1 Dec. 10, 2009

(51) Int. Cl.
*H03H 7/42* (2006.01)
*H03H 7/38* (2006.01)
*H01Q 9/16* (2006.01)
*H01Q 1/50* (2006.01)

(52) U.S. Cl. ............. 333/26; 333/34; 343/821; 343/859

(58) Field of Classification Search .................... 333/25, 333/26, 34; 343/821, 859
See application file for complete search history.

(56) References Cited

U.S. PATENT DOCUMENTS 6,531,943 B2 * 3/2003 Niu et al. ...................... 336/182
6,646,518 B2 * 11/2003 Tajima ............................ 333/26
7,109,821 B2 * 9/2006 Engargiola ...................... 333/26
7,903,042 B2 * 3/2011 Urban et al. .................. 343/797

OTHER PUBLICATIONS

M. Buck and D. Filipovic, "Bi-layer, mode 2, four-arm spiral antennas," Electronics Letters, Mar. 15, 2007, vol. 43, No. 6.
Nathan A. Stutzke, "Four-Arm 2nd- Mode Slot Spiral Antenna With Simple Single-Port Feed," IEEE Antennas and Wireless Propagation Letters, vol. 4, 2005, pp. 213-216.

* cited by examiner

*Primary Examiner* — Dean O Takaoka
(74) *Attorney, Agent, or Firm* — Thomas, Kayden, Horstemeyer & Risley, LLP

(57) ABSTRACT

Disclosed is a tapered double balun for use with rotationally-symmetrical, frequency-independent antennas that are fed using spiral-mode number 2. The tapered double balun may be used to provide a four-terminal line, where all terminals carry the same voltage, but adjacent terminals are out of phase and opposite terminals are in phase. The antennas may be spirals, sinuous, or other four-arm antennas. The tapered double balun is a stripline device comprising two outer ground planes and a center conductor that is dielectrically separated from the ground planes. The outer ground planes each taper from a wide dimension at the connector end of the device to a narrow dimension at the antenna end of the device. The narrow opposing strips comprising the ground planes are configured to connect to two opposed arms of the antenna. The center conductor is a single conductor at the connector end of the device that tapers to a larger conductor at the antenna end or may bifurcate to form two laterally separated conductors at the antenna end of the device. The center conductor is configured so that, whether single or bifurcated, it connects to the two remaining opposed arms of the antenna.

20 Claims, 5 Drawing Sheets

TAPERED DOUBLE BALUN

STATEMENT REGARDING FEDERALLY SPONSORED RESEARCH OR DEVELOPMENT

This invention was made in part with government support under Contract Number SC-0028-06-0001 awarded by the United States Air Force. Therefore, the government may have certain rights in this invention.

BACKGROUND

The present invention relates to baluns, and more particularly, to a tapered double balun that may be used with four-terminal antennas that are fed using spiral-mode number 2.

A balun is a device that converts a balanced transmission line to an unbalanced transmission line. For broad bandwidth, tapered baluns have been used for many years. Furthermore, currently available technologies for producing circular polarized omnidirectional antenna patterns require a complex stripline circuit that is expensive, gain-reducing, and bulky. Currently available technologies cannot easily produce an antenna pattern like that of a whip antenna from a very low-profile antenna.

Tapered baluns are discussed by Duncan, J. W., and Minerva, V. P., "100:1 Bandwidth balun transformer," Proc. IRE. Vol. 48, No. 2, 1960, pp. 156-164. The tapered balun is an excellent feed for very broadband, balanced antennas, such as spirals and sinuous antennas. Its bandwidth is limited only at the low-frequency end, which can be made arbitrarily low by making the taper longer. Furthermore, the tapered balun can be easily designed and fabricated in an inexpensive printed-circuit medium.

A four-arm spiral antenna that operates only in Mode 2 (see Corzine, R. G., and J. A. Mosko, Four-Arm Spiral Antennas, Artech House, 1990) has only two independent electrical terminals, since opposite arms theoretically can be connected together. However, practically, it is not obvious how to achieve this connection in a rugged and inexpensive way. A tapered coplanar-line feed has been reported by Gschwendtner, E., et al, in "Spiral antenna with frequency-independent coplanar feed for mobile communication systems" APS International Symposium, 1999, IEEE, Vol. 1, 11-16 Jul. 1999, p. 560-563, but a cavity will interfere with it, and the authors do not show that it is balanced at the feed point. It would be desirable to have a balun that solves the above-discussed problems and provides an improved technique to excite Mode 2 in four-arm spiral antennas.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Disclosed is a tapered double balun that provides for a four-terminal balanced feed line, where all terminals carry the same voltage, adjacent terminals are out of phase, and opposing terminals are in phase. Such a feed line is particularly useful for rotationally-symmetrical frequency-independent antennas that are fed using spiral-mode number 2. Exemplary antennas may be spirals, sinuous, or other four-arm antennas.

One use of the tapered double balun is to feed antennas that produce any omnidirectional antenna pattern for which circular polarization is desired. Omnidirectional patterns are used for many kinds of communications, navigation, control, data transmission, networking, and the like. Circular polarization avoids multipath in urban environments, and prevents fading from cross-polarization.

The problem addressed by the tapered double balun is to provide excitation for spiral-mode-2 in a rotationally-symmetrical frequency-independent antenna, such as a four-arm spiral antenna, for example. The required excitations for spiral-mode-2 are (+−+−); that is, the excitations are all real, with alternating sign as one moves from one arm of the antenna to the next at the feed point.

A tapered balun is band limited only at its low end, and that limit can be made arbitrarily low by making the taper longer. Such baluns are common for a two-arm spiral, but it has heretofore been difficult to devise a means of using two baluns for a four-arm or other rotationally-symmetrical frequency-independent antenna because one of the baluns must be reversed.

Figure 1A:
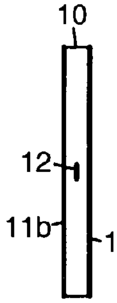
FIGS. 1, 1*a* and 1*b* illustrate top and end views of an exemplary tapered double balun having a tapered and bifurcated center conductor.
Figure 1:
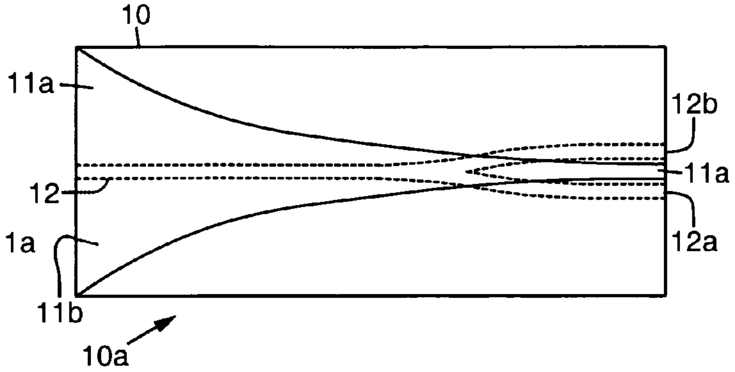
Figure 1B:
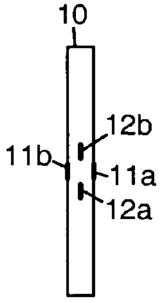
Figure 1C:
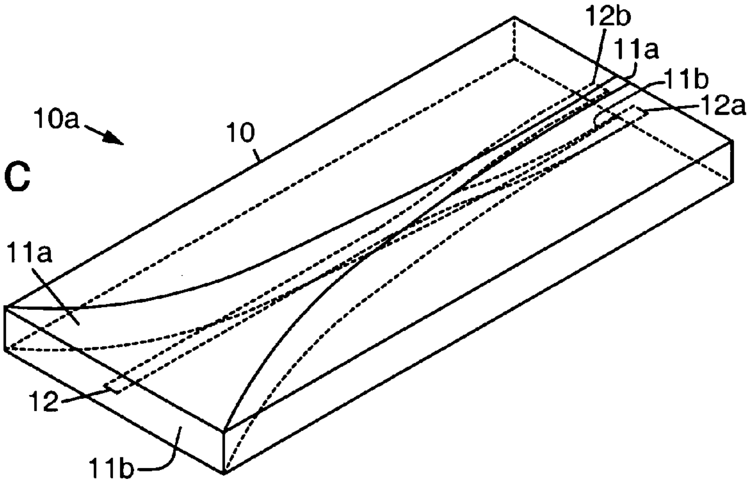
FIG. 1*c* illustrates a three-dimensional view of the exemplary tapered double balun shown in FIGS. 1, 1*a* and 1*b;*

Referring to the drawing figures, FIGS. 1, 1*a*, and 1*b* illustrate top and end views of an exemplary tapered double balun 10 having a tapered and bifurcated center conductor 12, FIG. 1*c* illustrates a three-dimensional view of the exemplary tapered double balun 10 shown in FIGS. 1, 1*a*, and 1*b*, and FIGS. 1*d*, 1*e*, and 1*f* illustrate top and antenna end views of an exemplary tapered double balun 10 having a tapered center conductor 12. The exemplary tapered double baluns 10 solves the problems discussed above very simply.

The exemplary tapered double balun 10 is configured to be coupled at its connector end (FIG. 1*a*) to an end-launched coaxial stripline connector. The tapered double balun 10 is also configured to be coupled at its antenna end (FIG. 1*b*) to a rotationally-symmetrical, frequency-independent antenna. Again, the rotationally-symmetrical, frequency-independent antenna may be a spiral antenna, sinuous antenna, or other four-arm antenna, for example. Typical antennas are disclosed in the above-cited "Four-Arm Spiral Antennas" book, for example The exemplary tapered double balun 10 comprises a stripline device 10*a* having two outer ground planes 11*a*, 11*b* and a center conductor 12 that is dielectrically separated from the ground planes 11_a_, 11_b_. The two outer ground planes 11_a_, 11_b_ taper to narrow opposing strips at the antenna end of the balun 10. In particular, the outer ground planes 11_a_, 11_b_ each taper from a large width at the connector end of the balun 10 to a narrow width at the antenna end of the balun 10. The narrow opposing strips comprising the two outer ground planes 11_a_, 11_b_ are configured to connect to two opposed arms of the antenna.

The center conductor 12 is a single conductor 12 at the connector end of the balun 10 that either tapers to a larger conductor at the antenna end of the balun 10 (FIGS. 1_d_, 1_e_, and 1_f_) or bifurcates to form two laterally separated conductors 12_a_, 12_b_ at the antenna end of the balun 10 (FIGS. 1, 1_a_, and 1_b_). The center conductor 12 is configured so that the laterally separated conductors 12_a_, 12_b_ can connect to two other opposed arms of the antenna. The center conductor is configured so that, whether single or bifurcated, it connects to the two remaining opposed arms of the antenna.

The balun 10 may be constructed using a first dielectric substrate that is metallized on both sides, and which is etched to form one of the outer ground planes 11_a_ on one side and the center conductor 12 on the other. A second dielectric substrate that is metallized on one side is etched to form the other outer ground plane 11_b_. The two dielectric substrates are then bonded together, along with other dielectric spacer layer, if necessary, to form the tapered double balun 10.

The respective tapers of the ground planes 11_a_, 11_b_ and center conductor 12 are configured to produce an unbalanced connector port to balanced antenna port balun 10. The respective tapers of the ground planes 11_a_, 11_b_ and center conductor 12 transform the impedance between the unbalanced connector port and the balanced antenna port. The ground planes 11_a_, 11_b_ and center conductor 12 are configured to transition between a three terminal unbalanced connector port and a four terminal balanced antenna port.

In operation, a coaxial stripline connector is attached to the connector end of the balun 10 so that its center conductor connects to the center conductor 12 of the balun and its housing connects to the outer ground planes 11_a_, 11_b_. A rotationally-symmetrical, frequency-independent antenna, such as a four-arm spiral antenna, for example, has its four feed terminals connected to the tapered ends of the outer ground planes 11_a_, 11_b_ and the two laterally separated conductors 12_a_, 12_b_ of the center conductor 12, at the antenna end.

The general requirements are that:

(1) The stripline characteristic impedance at the connector end matches that of the coaxial connection, usually 50 Ohms.

(2) The characteristic impedance of the 4-conductor transmission line at the antenna end is $Z_a$ from each conductor to ground (this assures balance).

(3) There is a smooth transition from one end to the other such that reflections are minimal over the frequency band of interest.

(4) The device has sufficiently low loss over the frequency band of interest.

Input Impedance

Figure 2:
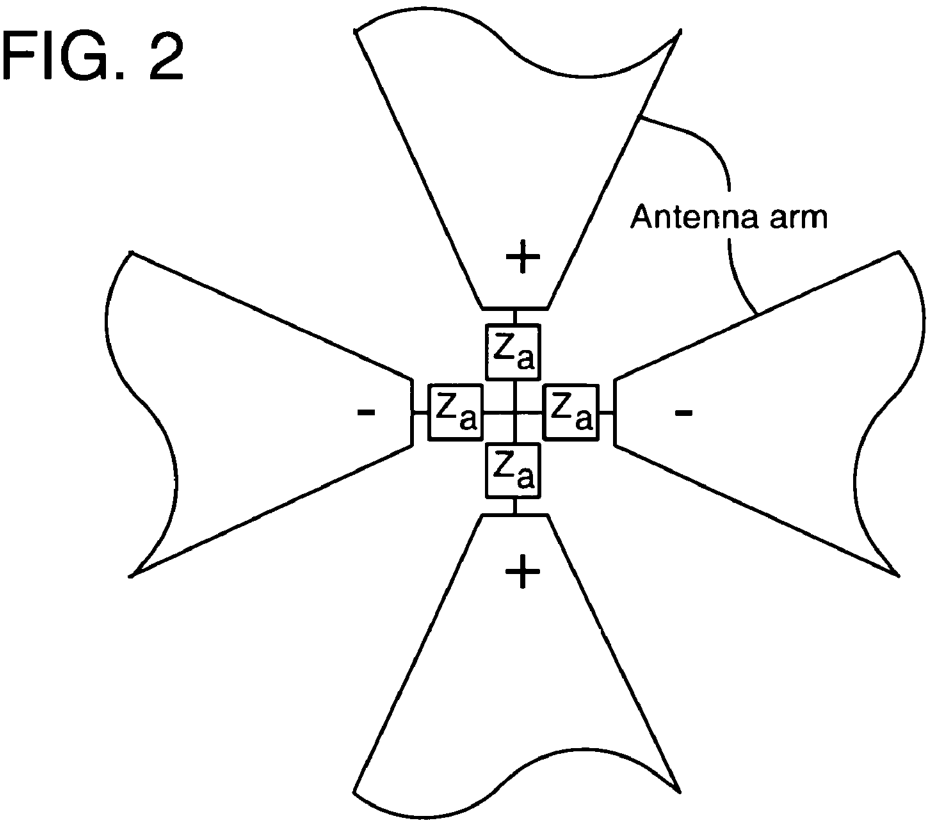
FIG. 2 illustrates arm impedance of an antenna to be fed with an exemplary tapered double balun.
Figure 3:
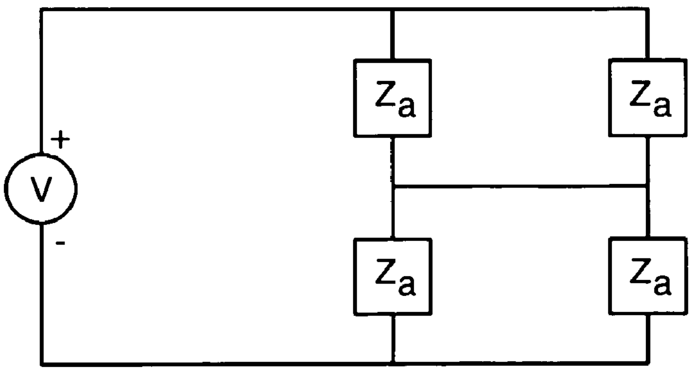
FIG. 3 illustrates an equivalent circuit of a spiral antenna fed using spiral-mode 2.

The required impedance is determined by observing that the antenna arm impedance is between the arm of the antenna and ground potential (either imaginary or the coaxial jackets of a coaxial feed connector), as illustrated in FIG. 2. If the two "+" arms of the antenna are connected to one side of the source and the two "−" arms of the antenna are connected to the other, a circuit such as is shown in FIG. 3 is obtained. Thus, the impedance presented to the source is $Z_a$.

Figure 4:
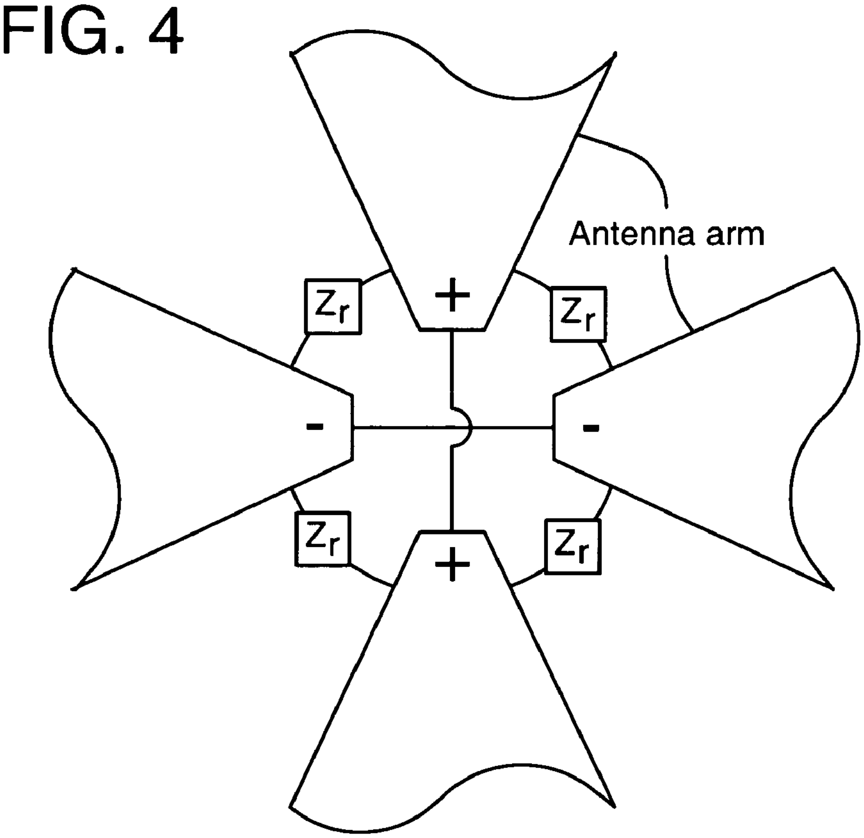
FIG. 4 illustrates a ring impedance configuration for an exemplary tapered double balun.

Another way to determine the input impedance for this case is to convert the arm impedances to ring impedances, illustrated in FIG. 4. It is the same as converting from Y impedances to Δ impedances in 3-phase power circuits. The general formula is $Z_r = NZ_a$, where N is the number of arms of the antenna. Again, if the two "+" arms of the antenna are connected to one side of the source and the two "−" arms of the antenna are connected to the other, then all the $Z_r$ are in parallel, and the total input impedance is $Z_r/4$, which is $Z_a$. The input impedance may be determined using a well-known formula cited in the above-cited "Four-Arm Spiral Antennas" book for the arm impedance (impedance from one arm of the antenna to ground) of an N-arm self-complementary structures:

$$Z_{arm} = 30\pi/\sin(\pi M/N)\text{, where M is the mode number.}$$

Figure 5:
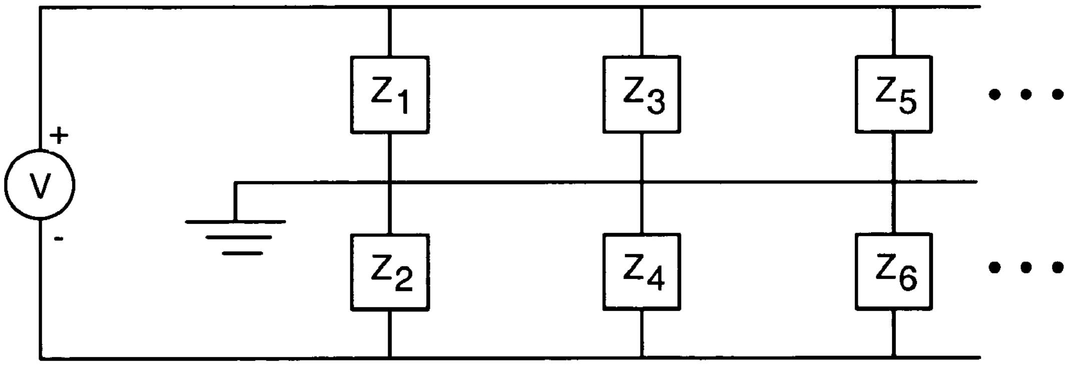
FIG. 5 illustrates an equivalent circuit of a multi-arm spiral antenna fed using general center mode.

When the number of arms of the antenna is even, there exists a "center mode" for which all input voltages are real and alternate in sign for feed terminals in progression. This mode is always M=N/2, so the arm impedance is always Z=30π. From the equivalent circuit shown in FIG. 5, the input impedance can be determined for any even number of arms. Since every impedance value is 30π, the input impedance may be calculated as $2Z_a/(N/2) = 120\pi/N$ for an N-arm spiral antenna. Thus, the input impedance is $Z_{in} = Z_a = 30\pi$.

Impedance of One Side

Figure 6:
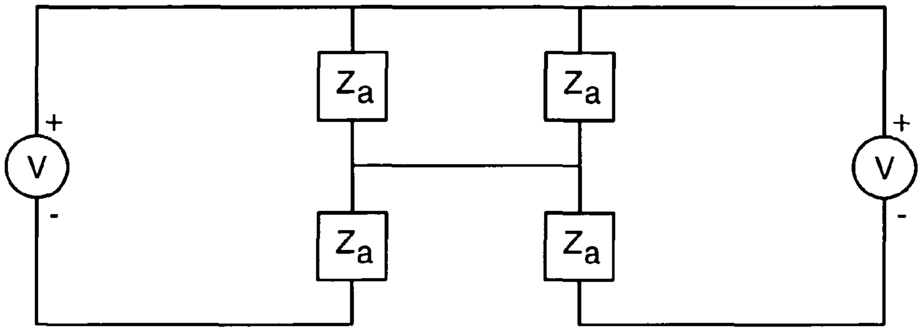
FIG. 6 illustrates an equivalent circuit of a spiral antenna showing impedance required on each side of a stripline.

For the tapered double balun 10, it is important to know what the impedance is from the center conductor 12 to each side (lateral edge) of the balun 10, so the line can be properly designed. Since one branch (say the "−" side) is split, it is necessary to know the impedance between the center conductor 12 and each side (lateral edge) of the balun 10. FIG. 6 shows an equivalent circuit with a split voltage generator (V). Since the voltage generators (V) are identical by definition, the circuit is symmetrical, and there will be no current flowing in the two horizontal center sections. Thus, each side may be considered separately, and therefore each input impedance is $2Z_a = 60\pi$ Ohms.

Balancing the Feed

The remaining theoretical issue is that the feed traces (i.e., ground planes 11_a_, 11_b_ and center conductor 12) need to be balanced at the feed point to the antenna (FIGS. 1_b_, 1_f_). That is, the impedances to ground must be the same, but there may be no ground conductor at the antenna end. Ordinarily a transmission line is balanced by its geometrical symmetry, but here symmetry cannot exist between the + and − sides of the feed; thus, balance must be determined another way. Balance is possible because, if the center conductor 12 were much larger, it would act as the ground for two microstrip lines, reversing the unbalance at the connector end of the taper. Somewhere between this imbalance and the opposite imbalance at the connector end of the balun 10 there is a balanced configuration. Since this is a two dimensional problem, the impedance of each side may be computed using conformal mapping were it not for the dielectric material (substrate).

With modern antenna software, the balance of a candidate line design may be evaluated by connecting it to a balanced antenna (dipole) and evaluating the behavior. If the line is not balanced, it will radiate and distort the patterns of the dipole. The line dimensions may be adjusted by trial and error until dipole patterns are the same as those from a configuration with a symmetrically balanced line.

Alternatively, the ground surface could be approximated by an enclosure around the balun 10, but it must be large since a tight enclosure will affect the impedance. If the design calls for an enclosure, it also must be large because it is difficult to obtain the required high impedance values with a tight enclosure.

Modeling the Balanced End

Figure 1E:
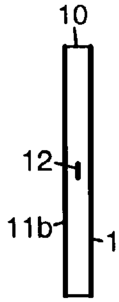
FIGS. 1*d*, 1*e*, and 1*f* illustrate top and antenna end views of an exemplary tapered double balun having a tapered center conductor.
Figure 1D:
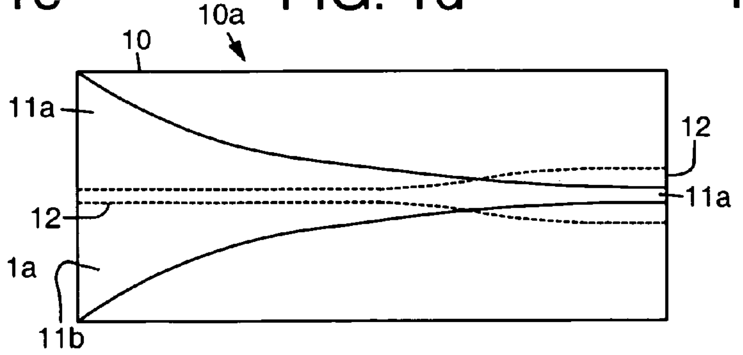
Figure 1F:
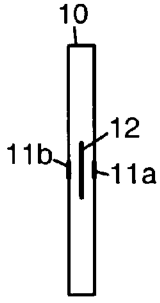

Since the impedances must be high, it is advantageous not to place the feed line within a conducting tube (cavity) as it traverses through the cavity. The goal was an impedance of 154 Ohms on each side because the actual antenna impedance is usually less than the theoretical 188 Ohms. An additional layer of dielectric (not shown) was used on each side of the balun 10 to act as additional spacing between the currents and an absorber often found within spiral cavities. For some applications, spacer layers may not be necessary. These spacer dielectric layers have no etched metallized surface, but they increase the total cost and they must be removed where the spiral antenna is attached (FIGS. 1*b*, 1*f*) and where the connector is attached (FIGS. 1*a*, 1*e*).

Transmission line problems are easily modeled using a High Frequency Structure Simulator (HFSS, an FEM code available from Ansoft) because it solves the two-dimensional problem for as many modes as desired. The normally used "driven mode" option of HFSS does not allow the user much control over the modes; rather the program identifies and solves for the characteristic modes. The modes that need to be compared to obtain balance are not characteristic modes; thus a "driven terminal" option was used. In this option, each conductor 12*a*, 12*b* and ground plane 11*a*, 11*b* in the transmission line is assigned a voltage, and the user is allowed to combine various conductors 11*a*, 11*b*, 12*a*, 12*b* into common and difference modes.

Figure 7:
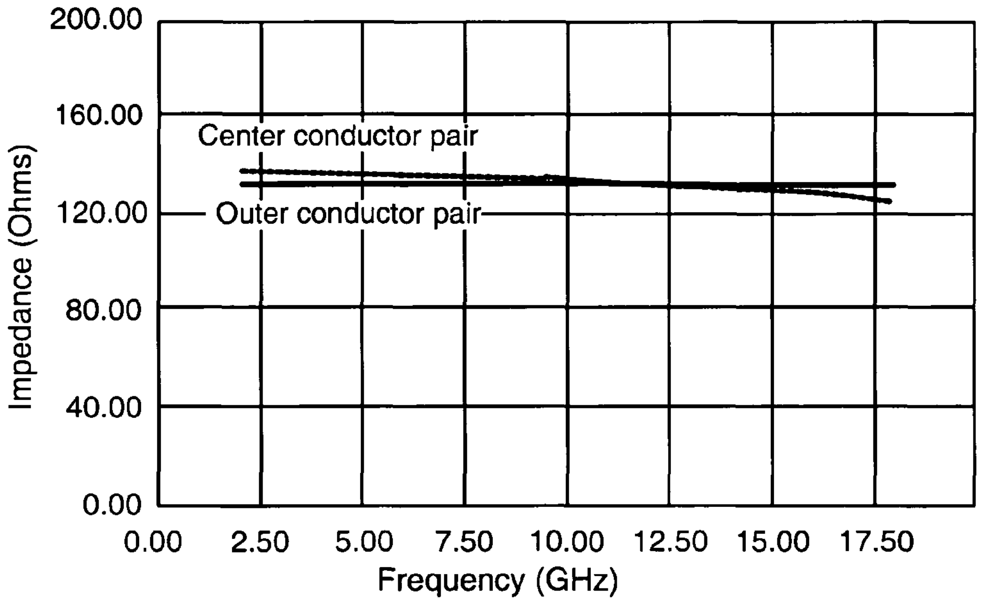
FIG. 7 is a graph showing calculated impedance of pairs of conductors to outer wall, indicating balance.

HFSS cannot readily compute impedances with respect to infinity, but it was decided that an enclosure (such as a pipe) around the transmission line provides a good approximation to infinity if the enclosure is large compared to the geometric details of the transmission line. Using this approximation, this model yielded an input impedance of 77 to 79 Ohms (slightly dispersive) and the reasonably good balance shown in FIG. 7. Notice that the impedance level in FIG. 7 is not significant because of the enclosure, only that the levels are matched.

Full Model

The design uses four 31-mil layers of Duroid 5880 bonded by 1-mil layers of prepreg glue between Duroid layers. For the starting point of the design, based on experience, the outer taper width was set at 0.2 inches where it enters the bottom of the cavity, which is 1.4 inches from the connector. If the width of the center conductor 12 remains constant at 54 mils, which produces 50 Ohms at the connector, it yields 45 Ohms at the entry point and rises to 53 Ohms when the outer ground conductors 11*a*, 11*b* eventually taper down to the same width as the laterally separated conductors 12*a*, 12*b*. About 1.5 inches before the antenna end of the balun 10, the center conductor 12 begins a tapered split to a 120 mil gap, while the outer ground conductors 11*a*, 11*b* taper further down to 45 mils.

Figure 8:
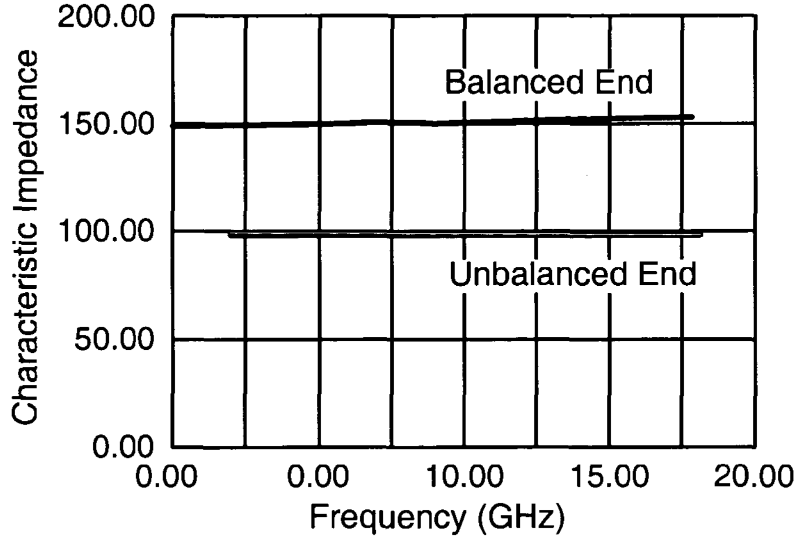
FIG. 8 is a graph showing calculated impedance at two ends of an exemplary tapered double balun shown in FIG. 9.

The impedance derived from the balun model for one side of each end is shown in FIG. 8. The balanced end (FIGS. 1*b*, 1*f*) has some minimal dispersion. However, the impedance balance is very similar to that shown in FIG. 7 for the port alone. Note that the balance cannot be perfect as long as the dispersion is different for each side.

Figure 9:
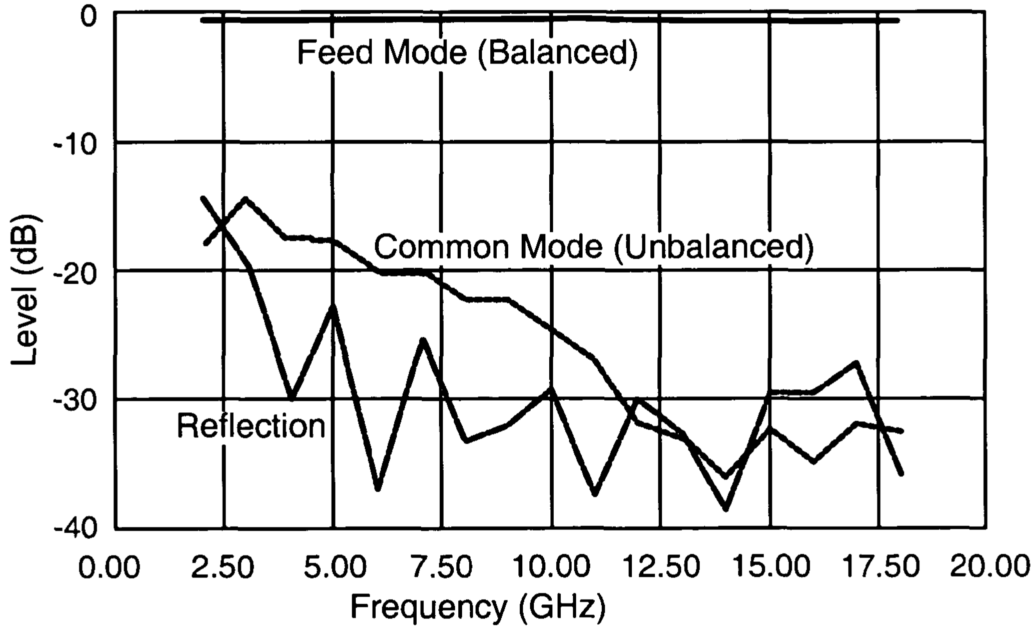
FIG. 9 is a graph showing distribution of signal input at the unbalanced end of an exemplary tapered double balun.

FIG. 9 shows actual coupling levels from the input port (connector end of the balun 10, FIGS. 1*a*, 1*e*) to the desired mode, the common mode, and to itself (reflection). Note that the unwanted output mode drops below −20 dB by 6 GHz. This excellent performance is believed to be due to the long taper length of the balun 10, which was not optimized for minimal length.

Thus, a tapered double balun for use with rotationally-symmetrical, frequency-independent antennas that are fed using spiral-mode number 2, for example, has been disclosed. It is to be understood that the above-described embodiments are merely illustrative of some of the many specific embodiments that represent applications of the principles discussed above. Clearly, numerous and other arrangements can be readily devised by those skilled in the art without departing from the scope of the invention.

What is claimed is:

1. Balun apparatus for use with an antenna, comprising:

a stripline device comprising two outer ground planes that taper from a wide dimension at a connector end of the device to a narrow dimension at an antenna end of the device, and a center conductor dielectrically separated from the ground planes that comprises a single conductor having a narrow dimension at the connector end of the device and that tapers to a larger conductor having a wider dimension at the antenna end of the device.

2. The apparatus recited in claim 1 wherein the center conductor bifurcates to form two laterally separated conductors at the antenna end of the device.

3. The apparatus recited in claim 1 wherein the respective tapers of the ground planes and center conductor are configured to produce an unbalanced connector port to balanced antenna port device.

4. The apparatus recited in claim 2 wherein the respective tapers of the ground planes and center conductor are configured to produce an unbalanced connector port to balanced antenna port device.

5. The apparatus recited in claim 1 wherein the ground planes and center conductor are configured to transition between a three terminal unbalanced connector port and a four terminal balanced antenna port.

6. The apparatus recited in claim 2 wherein the ground planes and center conductor are configured to transition between a three terminal unbalanced connector port and a four terminal balanced antenna port.

7. The apparatus recited in claim 1 wherein narrow ends of the ground planes respectively connect to two opposing arms of the antenna, and the center conductor connects to two remaining arms of the antenna along its wider dimension.

8. The apparatus recited in claim 2 wherein narrow ends of the ground planes respectively connect to two opposing arms of the antenna, and the center conductor connects to two remaining arms of the antenna along its wider dimension.

9. The apparatus recited in claim 1 wherein the antenna is a rotationally-symmetrical frequency-independent antenna selected from a group consisting of, a four-arm antenna, sinuous antenna, or spiral antenna.

10. The apparatus recited in claim 1 wherein the ground planes and center conductor carry the same voltage, adjacent terminals are out of phase and opposite terminals are in phase.

11. The apparatus recited in claim 2 wherein the ground planes and center conductor carry the same voltage, adjacent terminals are out of phase and opposite terminals are in phase.

12. Balun apparatus for use with an antenna, comprising:

a stripline device comprising two outer ground planes that taper from a wide dimension at a connector end of the device to a narrow dimension at an antenna end of the device, and a center conductor dielectrically separated from the ground planes that comprises a single conductor having a narrow dimension at the connector end of the device and that tapers to a larger conductor having a wider dimension at the antenna end of the device, wherein the respective tapers of the ground planes and shape of the center conductor are configured to provide an unbalanced connector port at one end and a balanced antenna port at the other end of the device.

13. The apparatus recited in claim 12 wherein the center conductor bifurcates to form two laterally separated conductors at the antenna end of the device.

14. The apparatus recited in claim 12 wherein the respective tapers of the ground planes and center conductor transform the impedance between the unbalanced connector port and the balanced antenna port.

15. The apparatus recited in claim 13 wherein the respective tapers of the ground planes and center conductor transform the impedance between the unbalanced connector port and the balanced antenna port.

16. The apparatus recited in claim 12 wherein the ground planes and center conductor are configured to transition between a three terminal unbalanced connector port and a four terminal balanced antenna port.

17. The apparatus recited in claim 13 wherein the ground planes and center conductor are configured to transition between a three terminal unbalanced connector port and a four terminal balanced antenna port.

18. The apparatus recited in claim 12 wherein narrow ends of the ground planes respectively connect to two opposing arms of the antenna, and the center conductor connects to two remaining arms of the antenna along its wider dimension.

19. The apparatus recited in claim 13 wherein narrow ends of the ground planes respectively connect to two opposing arms of the antenna, and the center conductor connects to two remaining arms of the antenna along its wider dimension.

20. The apparatus recited in claim 12 wherein the antenna is a rotationally-symmetrical frequency-independent antenna selected from a group consisting of, a four-arm antenna, sinuous antenna, or spiral antenna.

* * * * *